(12) United States Patent
Chidambaram

(10) Patent No.: US 7,339,215 B2
(45) Date of Patent: Mar. 4, 2008

(54) TRANSISTOR DEVICE CONTAINING CARBON DOPED SILICON IN A RECESS NEXT TO MDD TO CREATE STRAIN IN CHANNEL

(75) Inventor: PR Chidambaram, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/674,545

(22) Filed: Feb. 13, 2007

(65) Prior Publication Data

US 2007/0132027 A1 Jun. 14, 2007

Related U.S. Application Data

(62) Division of application No. 10/877,154, filed on Jun. 25, 2004, now Pat. No. 7,208,362.

(60) Provisional application No. 60/482,573, filed on Jun. 25, 2003.

(51) Int. Cl.
*H01L 29/76* (2006.01)

(52) U.S. Cl. ............. 257/288; 257/336; 257/368; 257/E29.255

(58) Field of Classification Search ............. 257/288, 257/336, 368, E29.255
See application file for complete search history.

(56) References Cited

U.S. PATENT DOCUMENTS 6,153,920 A * 11/2000 Gossmann et al. ......... 257/607
6,159,815 A * 12/2000 Lustig et al. ............... 438/305
6,358,806 B1   3/2002 Puchner
6,368,931 B1   4/2002 Kuhn et al.
6,492,216 B1  12/2002 Yeo et al.
6,563,152 B2   5/2003 Roberds et al.
6,583,015 B2   6/2003 Fitzgerald et al.
6,621,131 B2   9/2003 Murthy et al.
6,638,802 B1  10/2003 Hwang et al.
6,707,062 B2 * 3/2004 Lee ............................. 257/20
6,806,151 B2 * 10/2004 Wasshuber et al. ......... 438/301
2002/0033511 A1   3/2002 Babcock et al.
2004/0007715 A1   1/2004 Webb et al.
2004/0173815 A1 * 9/2004 Yeo et al. .................... 257/192
2005/0079692 A1   4/2005 Samoilov et al.

(Continued)

OTHER PUBLICATIONS

Solmi, S. and Nobili, D., "High concentration diffusivity and clustering of arsenic and phosphorus in silicon," Journal of Applied Physics, vol. 83, No. 5, Mar. 1, 1998, pp. 2484-2490.

(Continued)

*Primary Examiner*—T. N. Quach
(74) *Attorney, Agent, or Firm*—W. James Brady, III; Frederick J. Telecky, Jr.

(57) ABSTRACT

A method (100) of forming a transistor includes forming a gate structure (106, 108) over a semiconductor body and forming recesses (112) substantially aligned to the gate structure in the semiconductor body. Carbon-doped silicon is then epitaxially grown (114) in the recesses, followed by forming sidewall spacers (118) over lateral edges of the gate structure. The method continues by implanting source and drain regions in the semiconductor body (120) after forming the sidewall spacers. The carbon-doped silicon formed in the recesses resides close to the transistor channel and serves to provide a tensile stress to the channel, thereby facilitating improved carrier mobility in NMOS type transistor devices.

3 Claims, 10 Drawing Sheets

U.S. PATENT DOCUMENTS

2005/0082616 A1* 4/2005 Chen et al. .................. 257/350

OTHER PUBLICATIONS

Rim, K., et al., "Strained Si NMOSFETs for High Performance CMOS Technology," 2001 Symposium on VLSI Technology Digest of Technical Papers, pp. 59-60.

Rim, K., et al., Low Field Mobility Characteristics of Sub-100 nm Unstrained and Strained Si MOSFETs, 2002 IEEE, IEDM, pp. 43-46.

Thompson, Scott E., et al., "A Logic Nanotechnology Featuring Strained-Silicon," IEEE Electron Device Letters, vol. 25, No. 4, Apr. 2004, pp. 191-193.

* cited by examiner

TRANSISTOR DEVICE CONTAINING CARBON DOPED SILICON IN A RECESS NEXT TO MDD TO CREATE STRAIN IN CHANNEL

REFERENCE TO RELATED APPLICATION

This application is a divisional of application Ser. No. 10/877,154, filed Jun. 25, 2004, now U.S. Pat. No. 7,208,362, which claims the benefit of provisional Application No. 60/482,573, filed Jun. 25, 2003.

FIELD OF INVENTION

The present invention relates generally to semiconductor devices and more particularly to transistors and associated methods of manufacture having improved mobility due to channel strain.

BACKGROUND OF THE INVENTION

A conventional MOS transistor generally includes a semiconductor substrate, such as silicon, having a source, a drain, and a channel positioned between the source and drain. A gate stack composed of a conductive material (a gate conductor), an oxide layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor.

Generally, for a given electric field across the channel of a MOS transistor, the amount of current that flows through the channel is directly proportional to a mobility of carriers in the channel. Thus the higher the mobility of the carriers in the channel, the more current can flow and the faster a circuit can perform when using high mobility MOS transistors. One way to increase the mobility of the carriers in the channel of an MOS transistor is to produce a mechanical stress in the channel.

A compressive strained channel, such as a silicon-germanium channel layer grown on silicon, has significant hole mobility enhancement. A tensile strained channel, such as a thin silicon channel layer grown on relaxed silicon-germanium, achieves significant electron mobility enhancement. The most common method of introducing tensile strain in a silicon channel region is to epitaxially grow the silicon channel layer on a relaxed silicon-germanium (SiGe), layer or substrate. The ability to form a relaxed SiGe layer is important in obtaining an overlying, epitaxially grown, silicon layer under biaxial tensile strain, however the attainment of the relaxed SiGe layer can be costly and difficult to achieve.

Another prior art method of obtaining a tensile strain in the channel is to epitaxially grow a SiC layer over the entire active area. A disadvantage of this method is that carbon within the channel portion of the strain layer can migrate into the overlying gate oxide, thereby causing a relatively large interface trap density (DIT), which disadvantageously increases scattering and reduces the mobility advantages associated with the strained channel.

It would be advantageous to have a transistor device and method that effectively and reliably provides strain to the device in order to improve carrier mobility.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to a device and method of fabrication, wherein a transistor device exhibits improved mobility due to the application of stress to the channel. The device has a stress application region formed in the semiconductor body near the channel region; consequently, less stress inducing dopant is needed to obtain the desired strain within the channel, thereby providing improved carrier mobility without a substantial number of threading dislocation defects.

The stress inducing regions in the semiconductor body are formed by selective epitaxial deposition of a carbon doped silicon material within recesses formed in the body. The recesses are formed in the body prior to the formation of the sidewall spacers employed for source/drain implants. Consequently, the recesses are very close to the channel, and strain associated with the carbon doped silicon material therein is more effectively translated to the channel.

In accordance with one aspect of the present invention, a method of forming a transistor is provided, wherein a gate structure is formed over a semiconductor body, thereby defining a channel region therebelow. Recesses are formed in the body that are self-aligned with respect to the gate structure. In one example, such recesses are formed immediately after gate patterning or after formation of offset spacers (used for extension region implants) on lateral edges of the gate. The recesses are then filed with carbon doped silicon via a selective epitaxial deposition process. The carbon doped silicon material has a different lattice spacing than the silicon channel, thereby imparting a tensile strain to the channel region under the gate.

An extension region implant is then performed into the carbon doped silicon material, followed by the formation of sidewall spacers and source/drain implants. Having the carbon doped silicon material close to the gate as opposed to laterally spaced away (e.g., at the source/drain locations) advantageously allows less carbon to be employed in the recesses for a given desired stress, thereby reducing threading dislocation defects.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
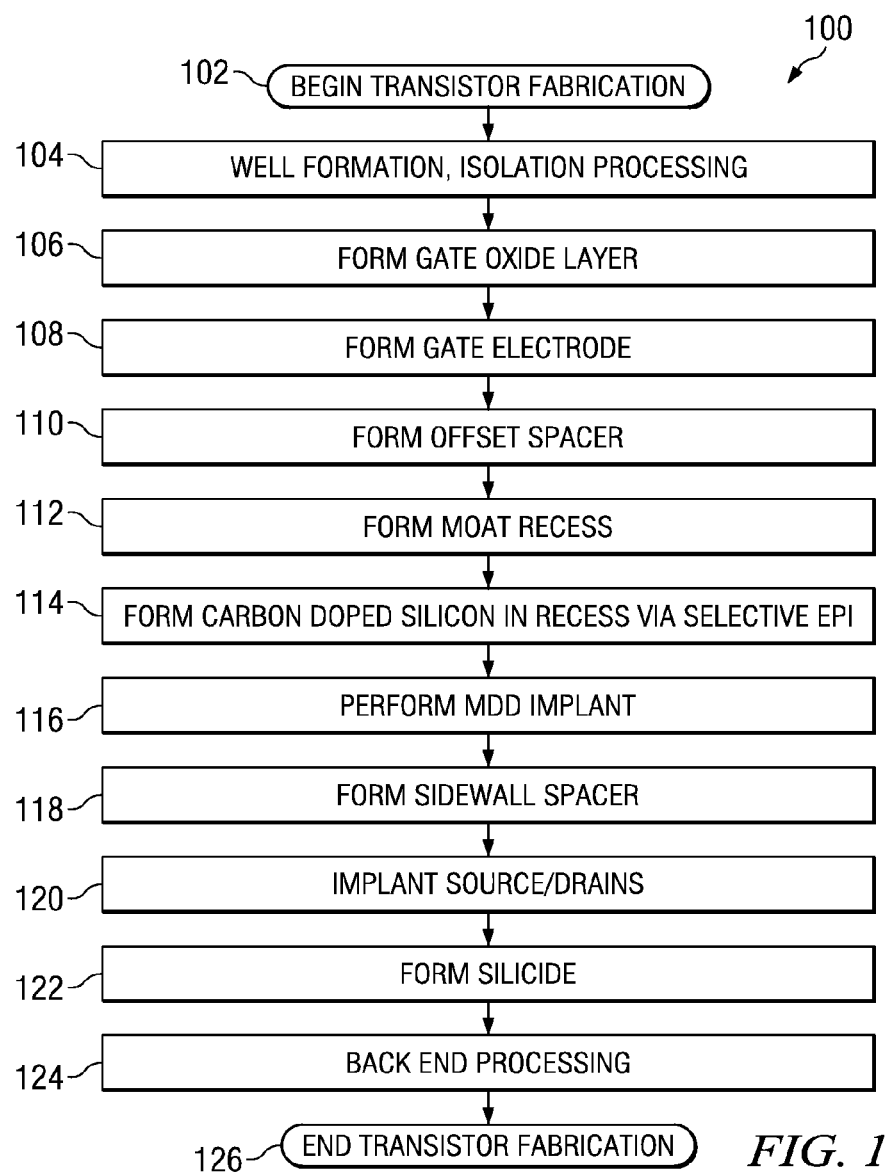
FIG. 1 is a flow chart illustrating a method of forming a transistor having improved mobility according to one aspect of the present invention.

One or more implementations of the present invention will now be described with reference to the attached drawings, wherein like reference numerals are used to refer to like elements throughout, and wherein the illustrated structures are not necessarily drawn to scale. The invention provides transistor structures and methods in which transistor mobility is improved while minimizing defects heretofore associated with conventional strained silicon device solutions.

Referring now to FIGS. 1 and 2A-2K, further aspects of the invention relate to methods of fabricating integrated circuits, wherein FIG. 1 illustrates an exemplary method 100 in accordance with the invention, and FIGS. 2A-2K illustrate the exemplary transistor device at various stages of fabrication in accordance with the invention. While the exemplary method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 100 begins at 102, wherein transistor fabrication is initiated, and transistor well formation and isolation processing is performed at 104. Act 104 thus defines NMOS and PMOS regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another.

The method 100 continues at 106, wherein a gate oxide layer is formed in active areas defined by the various formed isolation regions. In one example, the gate oxide comprises a thin, thermally grown silicon dioxide layer, however, other type gate dielectrics (such as high-k dielectrics) may be formed and are contemplated by the present invention. A conductive gate layer is then deposited over the gate oxide at 108 and patterned to form a conductive gate electrode. For example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes at 110. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate. The offset spacer, as will be further appreciated below, is employed in this example to space away the strain inducing material slightly away from the channel region under the gate, for example, a distance of about 10 nm to about 50 nm. A recess is then formed in the moat area extending between the gate structure and the isolation regions at 112. The moat area refers to the active region of the silicon body where extension regions and subsequently source/drain regions may be formed. The recess is formed using, for example, a dry etching process such as the chemistry employed to etch STI trenches in the semiconductor body when forming isolation regions. The recesses, in one example extend into the semiconductor body to a depth of about 30 nm to about 70 nm. In the present example, the gate structure is not masked during the recess formation; therefore if the gate electrode is composed of polysilicon, the recess formation process will also result in a recess formed in a top portion of the gate electrode material.

The method 100 then continues at 114, wherein carbon doped silicon is formed in the recesses. In one example, the carbon doped silicon is formed via a selective epitaxial deposition process such as an LPCVD (low pressure chemical vapor deposition) process using disilane and HCl as the source gases. By using HCl as an additional source gas, the silicon material formed in the recesses is doped with carbon in-situ. While not intending to be limited to any one theory, it is believed that the carbon doped silicon within the recesses form an alloy that has a lattice with the same structure as the silicon body lattice, however, the carbon doped silicon alloy has a smaller spacing. Consequently, it is believed that the carbon doped silicon within the recesses will tend to contract, thereby creating a tensile stress within the channel of the semiconductor body underneath the channel.

An MDD or extension region implant is then performed at 116, wherein dopants are introduced into silicon doped carbon material in the recesses (both in the moat area as well as on a top portion of the gate electrode). For example, lightly doped, medium doped or heavily doped extension region implants are performed in the NMOS and PMOS regions, respectively, wherein the gate structure serves to self-align the extension regions. Since both the recesses (now filled with carbon doped silicon) and the extension region implants are formed after the offset spacer, both are self-aligned with respect to the offset spacer, thereby placing both regions extremely close to the lateral edge of the gate structure within the semiconductor body. A thermal process such as a rapid thermal anneal is then employed to activate the extension region dopants, which causes the extension regions to diffuse laterally slightly underneath the offset spacer toward the channels.

Still referring to FIG. 1, sidewall spacers are then formed on the gate structures at 118. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate structure at least about 80 nm. The source/drain regions are then formed by implantation at 120, wherein a source/drain dopant is introduced into the exposed areas (top of gate electrode and active areas not covered by sidewall spacers). The source/drain regions are then completed with a thermal process to activate the dopant.

The method 100 then concludes with silicide processing at 122, wherein a metal layer is formed over the device, followed by a thermal process, wherein the metal and silicon interfaces react to form a silicide (on top of the gate and in the source/drain regions). Unreacted metal is then stripped away, and back end processing such as interlayer dielectric and metallization layers are formed at 124 to conclude the device formation at 126.

The method 100 of the present invention advantageously forms the silicon doped carbon extremely close to the channel region of the transistor device, only offset from the lateral edge of the gate structure about 10-50 nm. Because the carbon is not readily activated, it is advantageous for the carbon to be close to the channel to impart the desired strain. Conventional solutions that employed carbon in the source/drain regions (formed after the wider sidewall spacers) resulted in carbon spaced substantially further away from the channel, for example, about 80 nm or more. Consequently, in order for conventional solutions to impart a desired strain, approximately four (4) times more volume of carbon is used, thereby increasing the number of threading dislocation defects.

In the present invention, therefore, substantially less carbon is needed to impart the desired tensile strain on the channel, thereby substantially reducing the number of threading dislocation defects and the performance degradation associated therewith. In accordance with the present invention, the amount of carbon in the recess comprises about 0.3 atomic percent to about 2 atomic percent, wherein such a range of carbon results in a tensile strain in the channel of about 300 MPa to about 2 GPa. Consequently, the formation of the recesses prior to the sidewall spacer formation advantageously provides for substantially improved transistor performance by increasing the electron mobility while mitigating undue formation of threading dislocation defects. In addition, another advantage of incorporating the carbon close to the channel as provided in the present invention is that the carbon is believed to act as a gettering agent for interstitials, thereby serving to retard diffusion. For example, the presence of carbon near the channel serves to retard a boron halo dopant diffusion (e.g., for NMOS) and therefore helps to create a steep retrograde profile associated therewith.

Figure 2A:
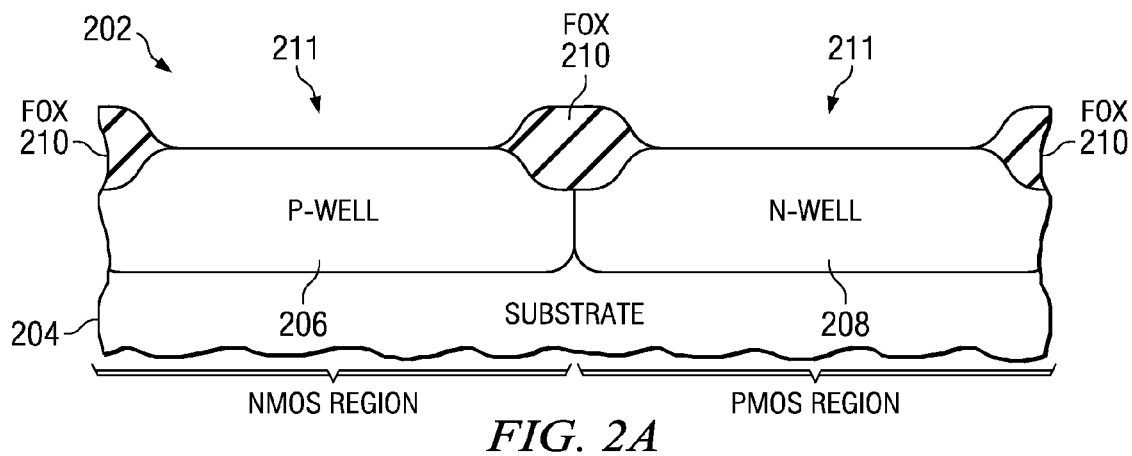
FIGS. 2A-2K are fragmentary cross section diagrams illustrating various steps of forming NMOS and PMOS transistors in accordance with the invention of FIG. 1.
Figure 2B:
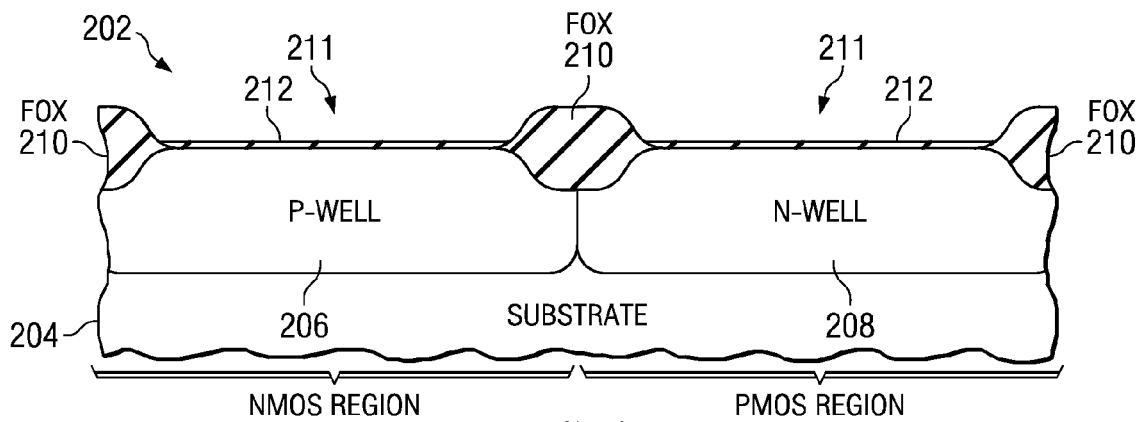

Turning now to FIGS. 2A-2K, a plurality of fragmentary cross section diagrams illustrating a transistor device being formed in accordance with the present invention of FIG. 1 is provided. In FIG. 2A, a transistor device 202 is provided, wherein a semiconductor body 204, such as a substrate, has a number of wells formed therein, such as a P-well 206 to define an NMOS transistor device region and an N-well 208 to define a PMOS transistor device region, respectively. Further, isolation regions 210 such as STI regions are formed in the semiconductor body to define active area regions 211, as may be appreciated. In FIG. 2B, the transistor device 202 is illustrated, wherein a gate oxide 212 has been formed, for example, thermally grown $SiO_2$, over the active areas 211.

Figure 2C:
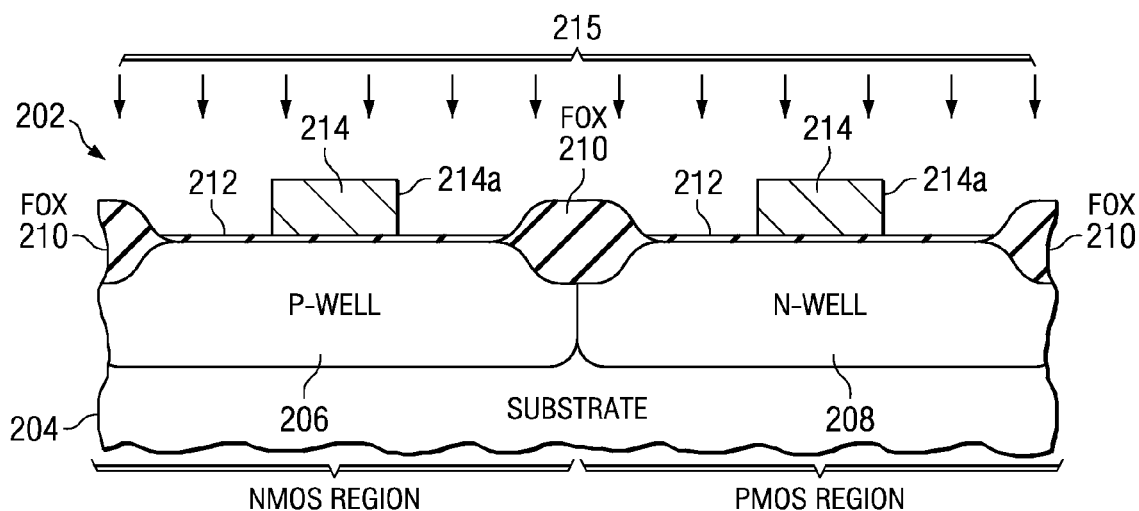
Figure 2D:
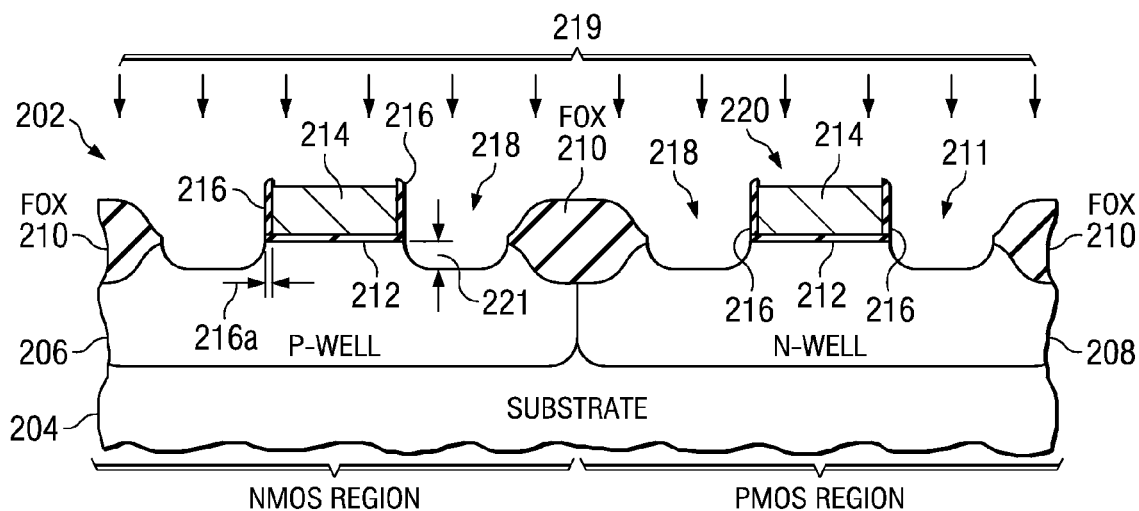

Referring to FIGS. 2C and 2D, a conductive gate electrode material (e.g., polysilicon) has been deposited and patterned via an etching process 215 to form a gate electrode 214 overlying the gate oxide 212. An offset spacer 216 is then formed on the lateral edges 214a of the gate electrode, wherein the offset spacers have a width 216a of about 10-50 nm. Recesses 218 are then formed in the active areas using an etch process 219, wherein the gate electrode 214 and isolations areas 210 serve as a mask. In the case where the gate electrode comprises polysilicon, the etch process 219 will also create a recess 220 in a top portion of the gate structure, as illustrated in FIG. 2D. The recesses 218 are formed into the semiconductor body to a depth 221 of about 30-70 nm, for example. Although the example illustrated herein has the recesses 218 formed after an offset spacer, such recesses may be formed prior to such a spacer, wherein in such instance the recesses 218 are aligned to the lateral edges 214a of the gate structures. In such instances, care should be taken to prevent a shorting of the gate to the subsequently formed epi by providing some type of isolation therebetween.

Figure 2E:
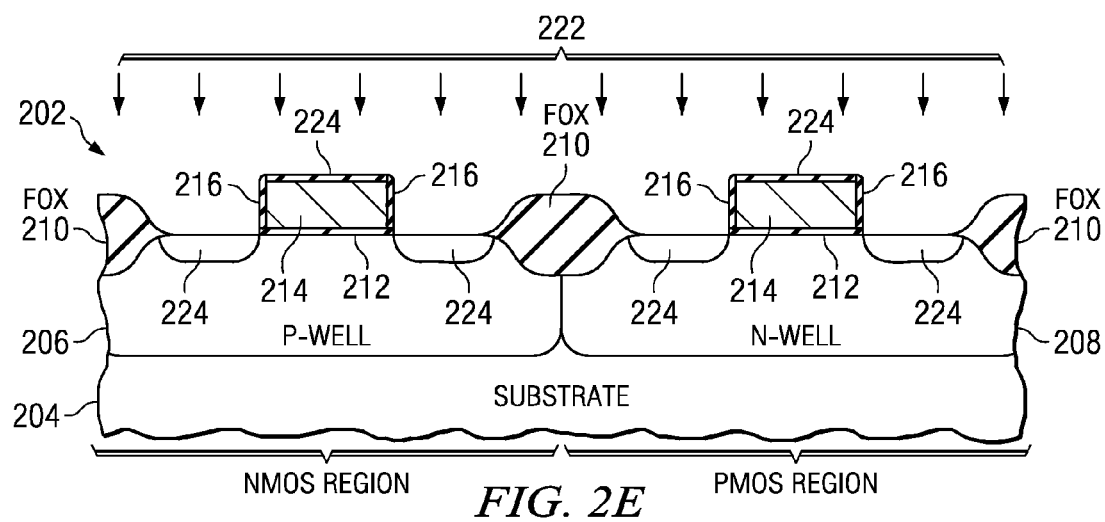
Figure 2F:
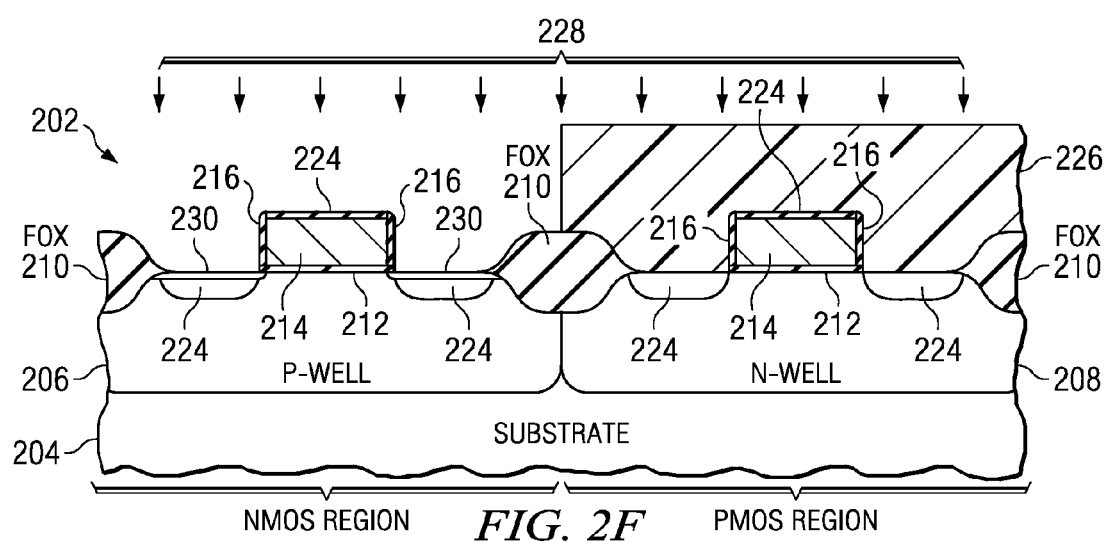

Turning now to FIG. 2E, a selective epitaxial deposition process 222 is provided, wherein a carbon doped silicon material 224 is formed on top of the gate electrode 214 (in the recess 220) and also in the recesses 218. As highlighted above, the process 222 may comprise an epitaxial deposition process, wherein a carbon containing source gas such as HCl is added, such that the silicon is doped with carbon in-situ. The PMOS region is then masked off, as illustrated in FIG. 2F with a masking material 226 such as photoresist, and an extension region implant 228 is performed to form n-type extension regions 230 in the NMOS region. A thermal process such as a rapid thermal anneal is then performed to activate the dopant, wherein a lateral diffusion of the extension regions 230 under the offset spacer 216 is achieved.

Figure 2G:
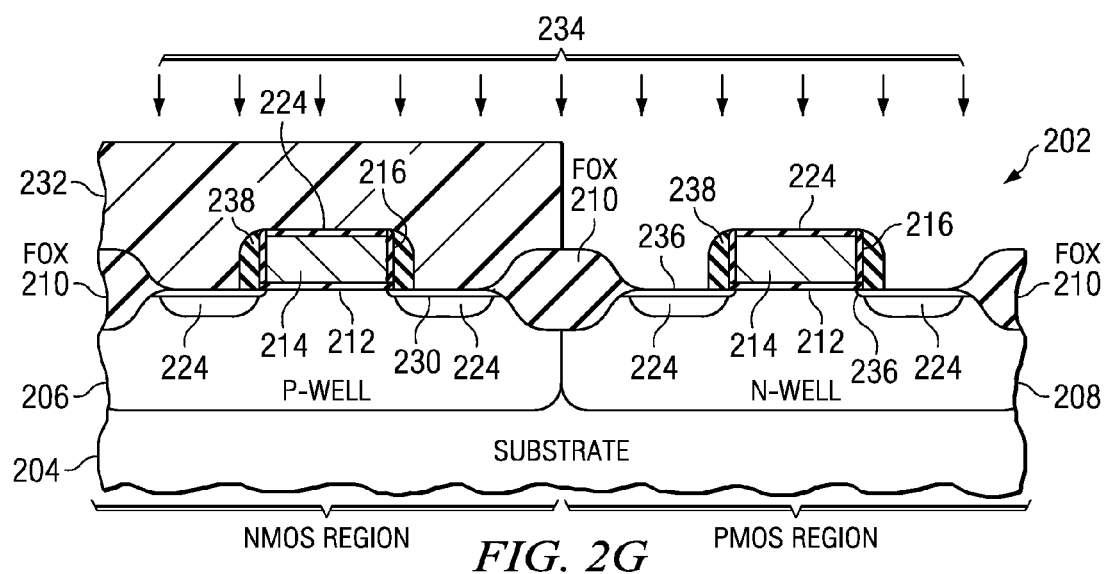
Figure 2H:
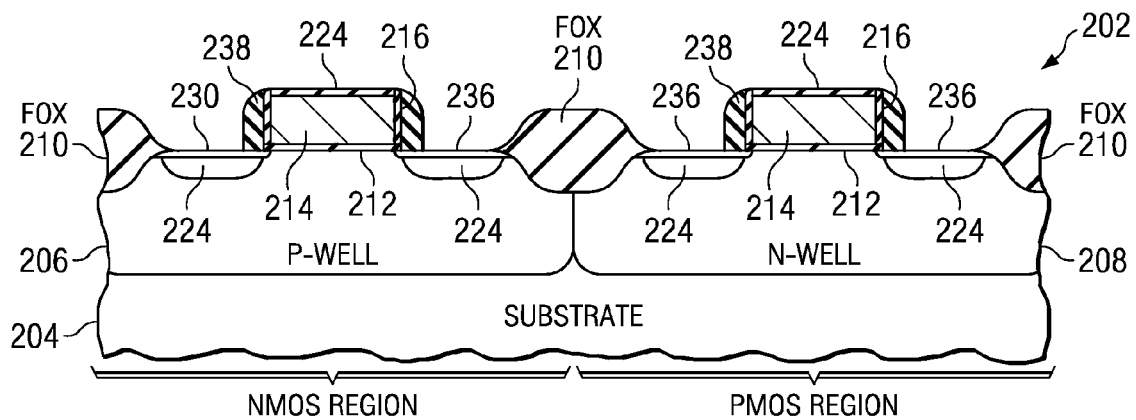

The n-type extension region mask 226 is then removed, and a p-type extension region mask 232 is deposited and patterned to cover the NMOS region, as illustrated in FIG. 2G. A p-type extension region implant process 234 is then performed to form p-type extension regions 236 in the PMOS region, as illustrated. The mask 232 is then removed and sidewall spacers are formed over the offset spacers 216 on the lateral edges of the gate structures. An insulating sidewall material is deposited in a generally conformal manner over the device and subsequently subjected to an anisotropic etch to remove the insulating material on top of the gate and over the active areas, leaving sidewall spacers 238 in both the NMOS and PMOS regions, as illustrated in FIG. 2H.

Figure 2I:
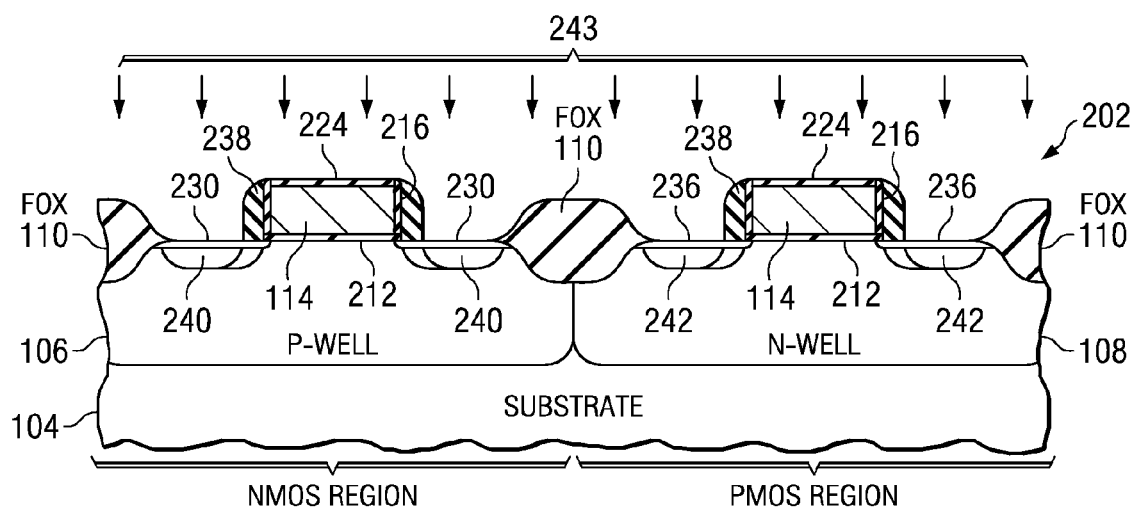

Source and drain regions 240 and 242 are formed in the NMOS and PMOS regions, respectively. As discussed above in conjunction with the extension region implants, the source/drain implants 243 are performed with an NSD mask (not shown) and then a PSD mask (not shown) in order to implant the NMOS region and the PMOS region separately with n-type and p-type dopant, respectively. As can be seen in FIG. 2I, the source/drain regions 240, 242 are self-aligned with respect to the sidewall spacers, and thus are laterally spaced from the extension regions 230, 236 and the carbon doped silicon strain regions 224 nearest the channel (underlying the gate 214).

Figure 2J:
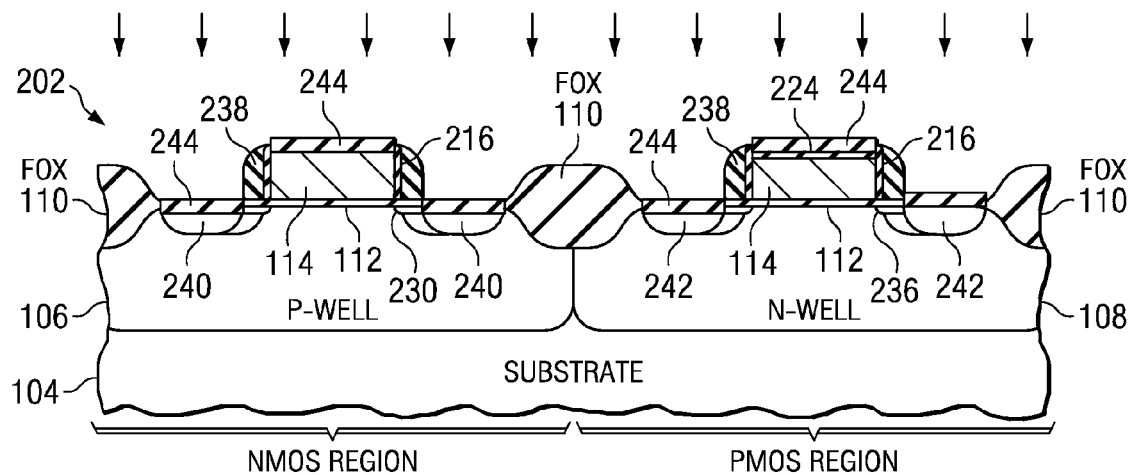

The method then concludes with silicidation, wherein a metal layer is deposited, for example, via sputtering, over the device, followed by a thermal process. During the thermal processing, those regions where the metal contacts silicon reacts to form a metal silicide, as illustrated in FIG. 2J. More particularly, the silicide 244 forms on the source/drain regions and on top of the gates as illustrated. Subsequently, back end processing including metallization may be performed to interconnect the various transistors, as may be desired.

Figure 2K:
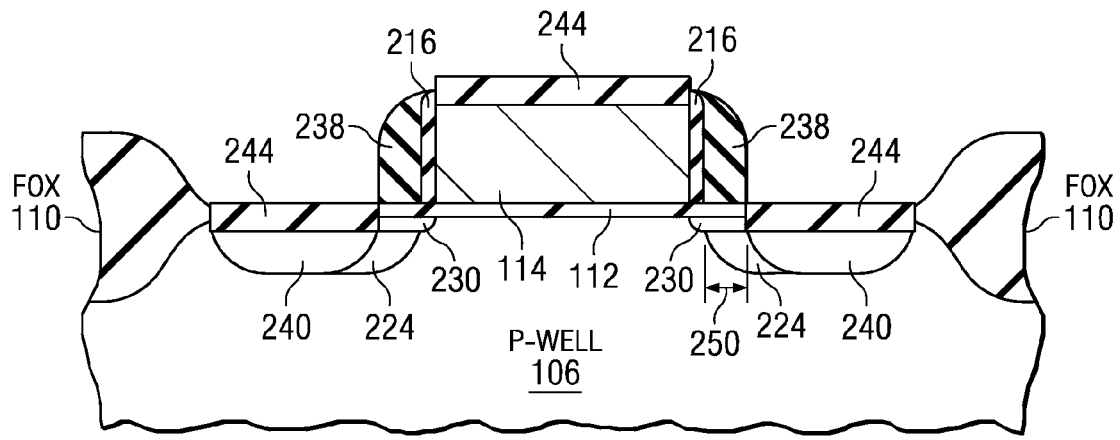

Looking now at FIG. 2K, an enlarged view of the resulting NMOS transistor fabricated in accordance with the invention of FIG. 1 is illustrated. Note that the carbon doped silicon stress inducing region 224 is substantially closer to the channel than the source/drain regions 240, for example, by a distance 250. Having the carbon doped region 224 substantially closer to the channel provides for a substantial improvement over the prior art in that substantially less carbon is needed to impart the desired tensile stress to the channel. Consequently, with less carbon needed, few threading dislocation defects are generated, thereby resulting in substantial performance improvements over the prior art, for example, reduced leakage.

Figure 3:
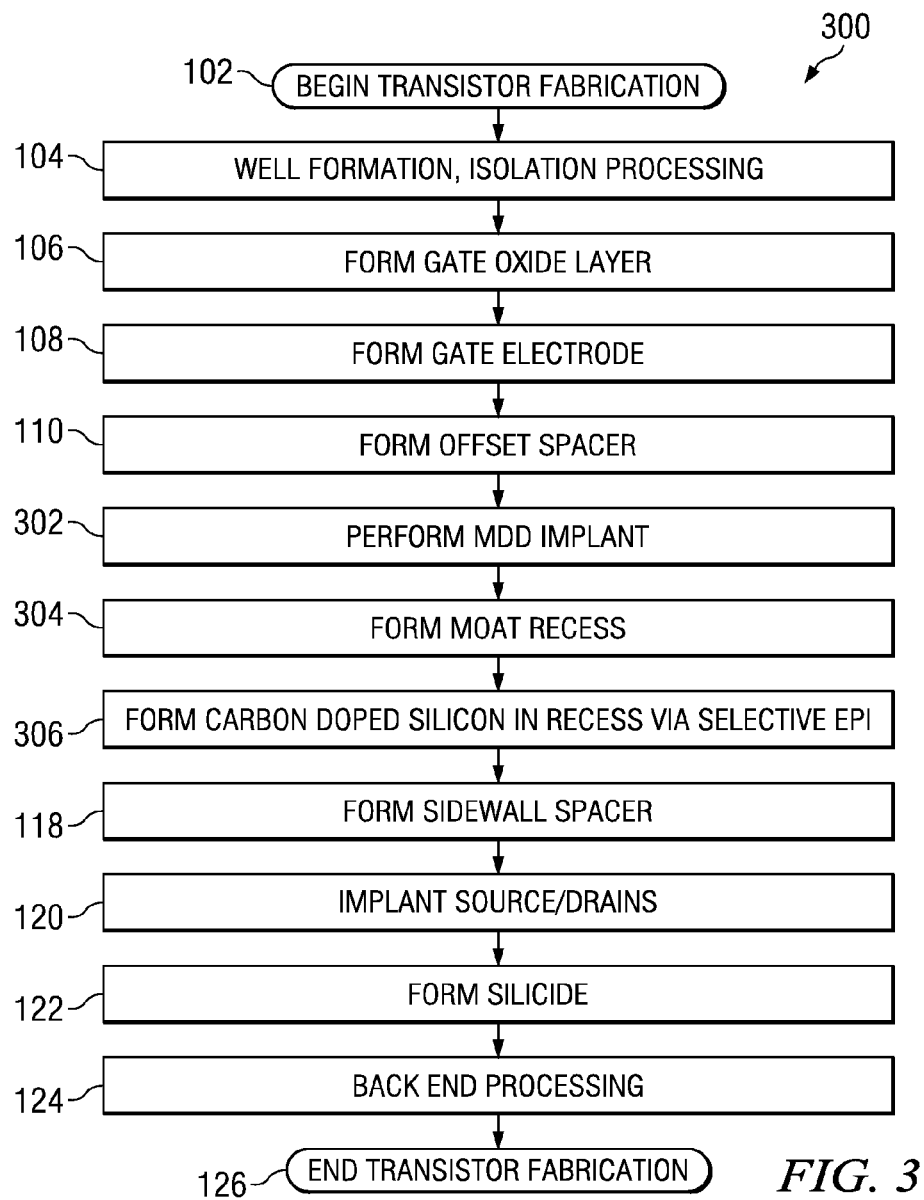
FIG. 3 is a flow chart diagram illustrating a method of forming a transistor having improved mobility according to another aspect of the present invention.

In accordance with another aspect of the invention, FIG. 3 is a flow chart directed to another method of forming a transistor device having improved mobility due to an efficient application of tensile strain to the channel, and is designated at reference numeral 300. The method 300 is similar in many respects to the method 100 of FIG. 1, and with regards to such aspects, those portions will not be repeated again. For example, acts 102-110 may proceed generally in the same manner as method 100. At 302, an extension region implant is performed after the offset spacer has been formed on lateral edges of the gate structure. Recesses are then formed in the active area (and also on top of the gate) at 304 after the extension regions have been formed. A carbon doped silicon material is then formed in the recesses at 306 to form a strain-inducing region near the channel. The method 300 may then proceed at 118-126 in a manner similar to that of method 100. Consequently, the method 300 indicates that the order in which the extension regions are formed and the recesses are formed may be switched, and either alternative is contemplated as falling within the scope of the present invention.

Figure 4A:
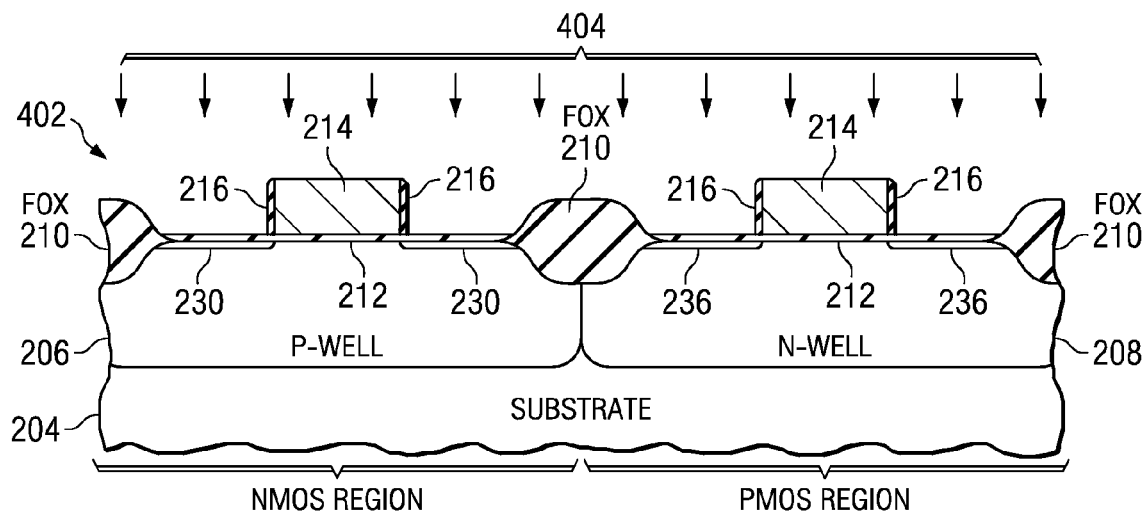
FIGS. 4A-4F are fragmentary cross section diagrams illustrating various steps of forming NMOS and PMOS transistors in accordance with the invention of FIG. 3.

FIGS. 4A-4F illustrate the fabrication of the transistor devices in accordance with the method 300 of FIG. 3. As illustrated in FIG. 4A, a transistor device has NMOS and PMOS regions as before with P-well and N-well regions 206 and 208 formed in a semiconductor body 204. Isolation regions 210 also are provided to define active areas for fabrication of transistor devices. A gate oxide 212 overlies the active regions and a patterned conductive gate electrode 214 is formed thereover. Offset spacers 216 reside on lateral edges of the gate 214 and an extension region implant process 404 (e.g., an n-type followed by a p-type) is provided in conjunction with appropriate masking to form extension regions 230 and 236, respectively. A subsequent thermal anneal causes the extension regions 230 and 236 to diffuse laterally to extend slightly under the offset spacers 216.

Figure 4B:
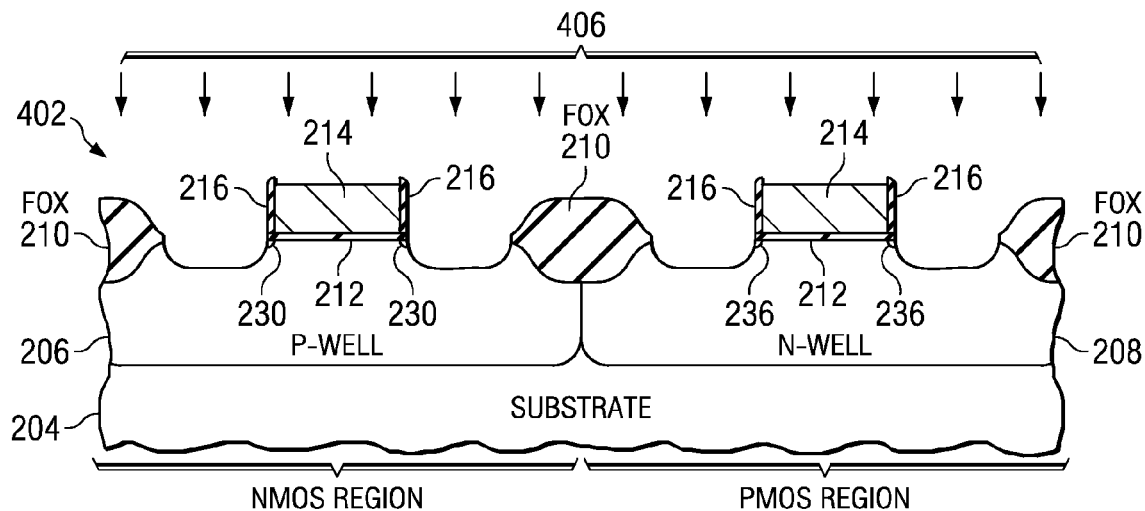
Figure 4C:
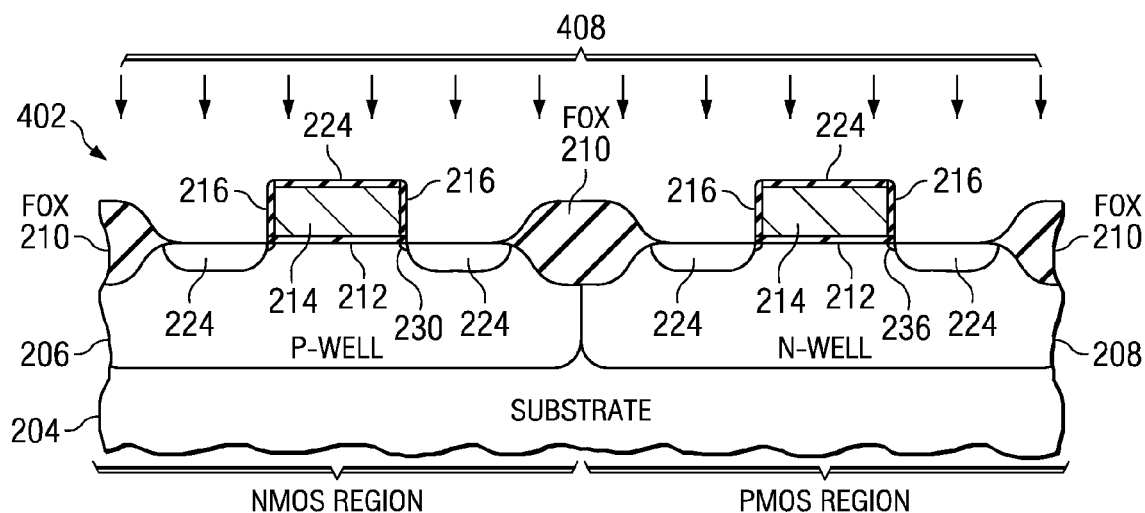

Recesses 406 are then formed in the active areas (and on top of the gate electrodes 214) after the extension region implant via an etch process 406, as illustrated in FIG. 4B. Because the extension regions have diffused slightly under the offset spacers 216 and the recesses are self-aligned with respect to the spacers, small portions of the extension regions remain near the channel, as illustrated. A carbon doped silicon material 224 is then formed in the recesses and on top of the gate electrode as illustrated in FIG. 4C, via a selective epitaxial deposition process 408.

Figure 4D:
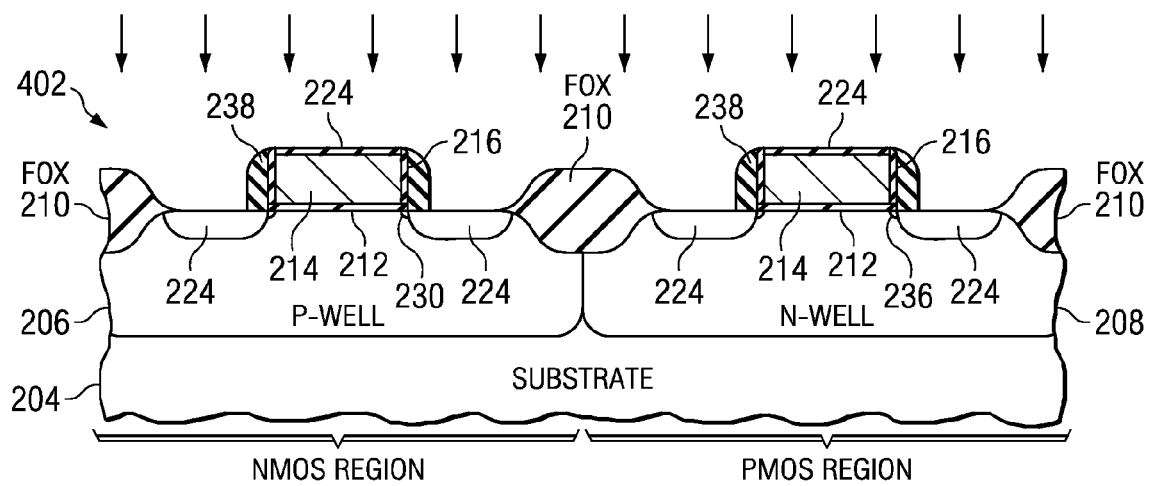
Figure 4E:
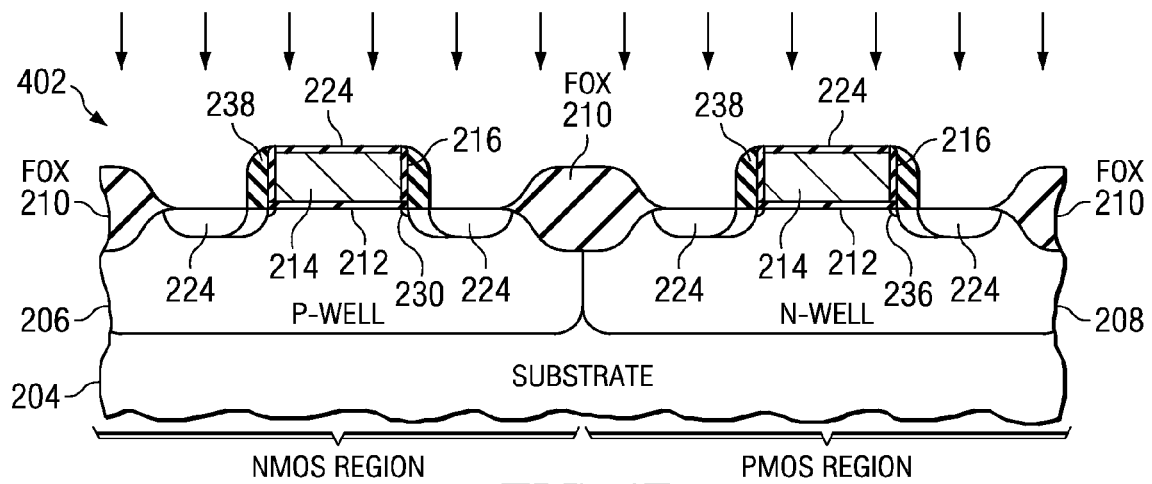
Figure 4F:
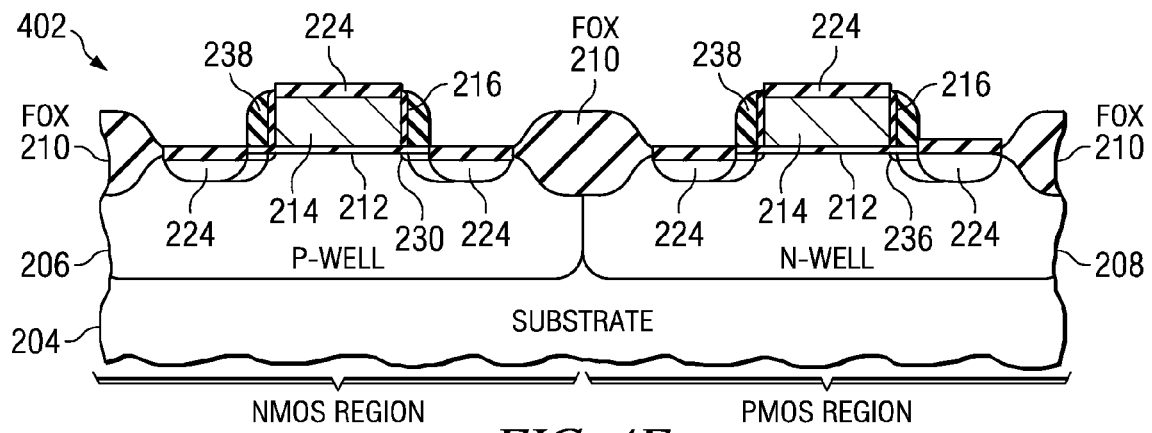

FIGS. 4D-4F progress similarly to that described in the previous method, wherein sidewall spacers are formed, followed by the source/drain implants (in NMOS regions and then PMOS regions, respectively) and then silicidation. Note that after the source/drain implants, a thermal process is employed to activate the dopants, which causes some lateral diffusion thereof, thereby causing the source/drain regions to connect with the respective extension regions.

In the methods of FIGS. 1 and 3, the recesses and carbon-doped selective epitaxial process is performed in both the NMOS and the PMOS regions. The inventors of the present invention discovered that although the tensile strain provided by the carbon doped silicon material effectively improves electron mobility substantially for NMOS performance improvement, that the presence of carbon in the PMOS regions does not have a substantial deleterious impact on hole mobility in the PMOS regions. Accordingly, the present invention contemplates providing of recesses and carbon doped silicon material in both the NMOS and PMOS regions as shown. In addition, according to another alternative of the present invention, the recesses and filling thereof with carbon doped silicon material may be performed solely in the NMOS regions of the device, as will be discussed below and illustrated in conjunction with FIGS. 5 and 6A-6G.

Figure 5:
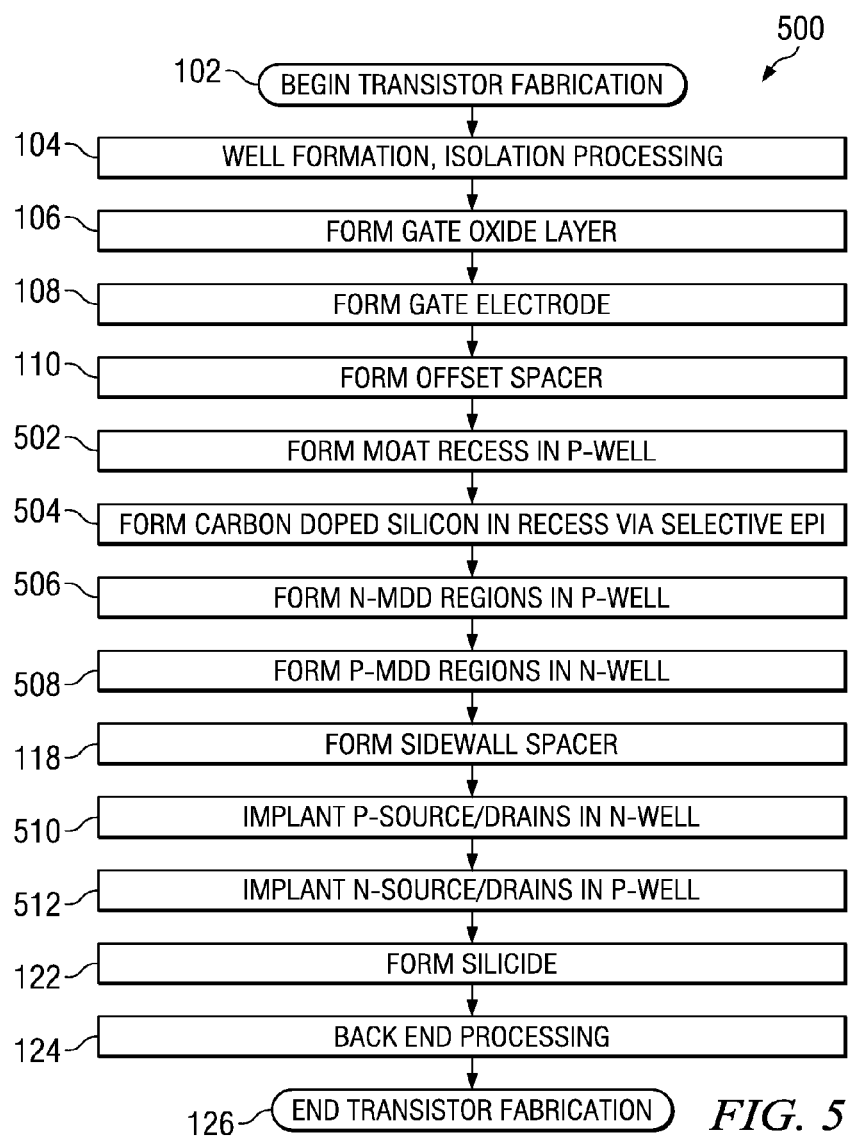
FIG. 5 is a flow chart diagram illustrating a method of forming a transistor having improved mobility according to yet another aspect of the present invention.

Turning now to FIG. 5, a method 500 is disclosed wherein an NMOS transistor is formed in a CMOS process that exhibits improved carrier mobility due to a tensile strain applied to the channel. Acts 102-110 may proceed in a manner similar to that discussed supra. At 502, a moat recess is selectively formed in a P-well (an NMOS region) by masking off the N-well (the PMOS region) and performing a silicon etch after the formation of offset spacers on the gate electrodes. Carbon doped silicon is then formed in the recesses (in the active areas as well as on top of the gate electrode) in the NMOS region at 504 while the mask is maintained on the PMOS region, thereby preventing such material to form therein. N-type extension regions are then formed at 506 with the mask still in place, thereby doping the carbon doped silicon material within the recesses with n-type dopants. A thermal process then causes the n-type dopant to diffuse laterally under the offset spacers, and toward the channel. Alternatively, the n-type extension regions may be formed prior to forming the recesses.

The method 500 continues at 508 by removing the mask in the PMOS region, depositing and patterning another mask over the NMOS region, and performing a p-type extension region implant into the N-well in the PMOS region to form p-type extension regions that are self-aligned with respect to the offset spacers. The mask is then removed and sidewall spacers are formed at 118 over the offset spacers in both the NMOS and PMOS regions. Another mask is deposited and patterned to cover the NMOS region and a p-type source/drain implant is performed 510 therein to form p-type source/drain regions that are self-aligned with respect to the sidewall spacers. The mask is then removed and a second mask is provided to cover the PMOS regions, and an n-type source/drain implant is performed at 512 in the NMOS regions to form n-type source/drain regions therein that are self-aligned with respect to the sidewall spacers. Silicide processing 122 and back end processing 124 may then proceed in a typical manner.

Figure 6A:
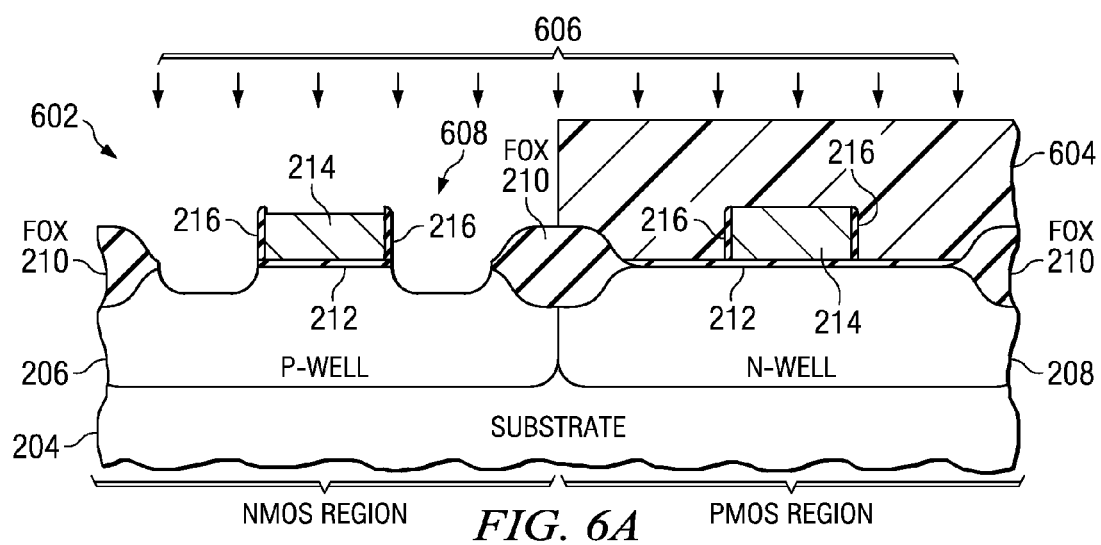
FIGS. 6A-6G are fragmentary cross section diagrams illustrating various steps of forming an NMOS transistor in accordance with the invention of FIG. 5.
Figure 6B:
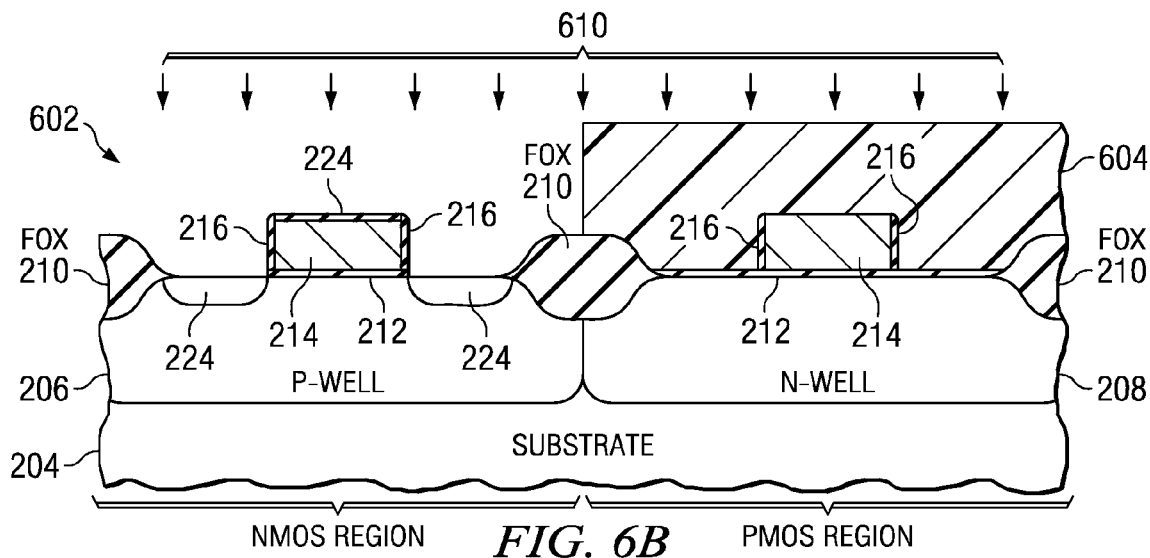
Figure 6C:
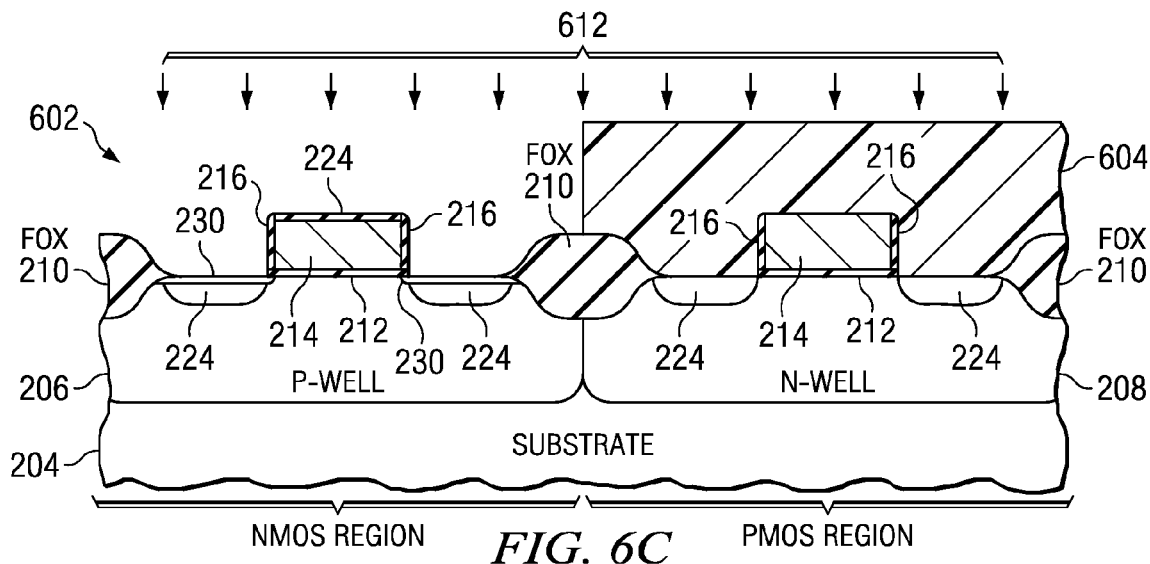

In FIG. 6A, the device 602 is illustrated with a mask 604 over the PMOS region, and an etch process 606 is performed to form the recesses 608 in the active areas defined by the offset spacers 216 and the isolation regions 210, as well as on top of the gate electrode 214 (when the gate comprises polysilicon). In FIG. 6B, a selective epitaxial deposition process 610 is performed, wherein a carbon doped silicon material is formed in the recesses 608 while the mask 604 continues to mask the PMOS region. The NMOS region is then subjected to an n-type extension region implant 612, wherein the n-type extension regions are formed (FIG. 6C). A subsequent thermal anneal causes the extension regions to diffuse laterally slightly under the offset spacers.

Figure 6D:
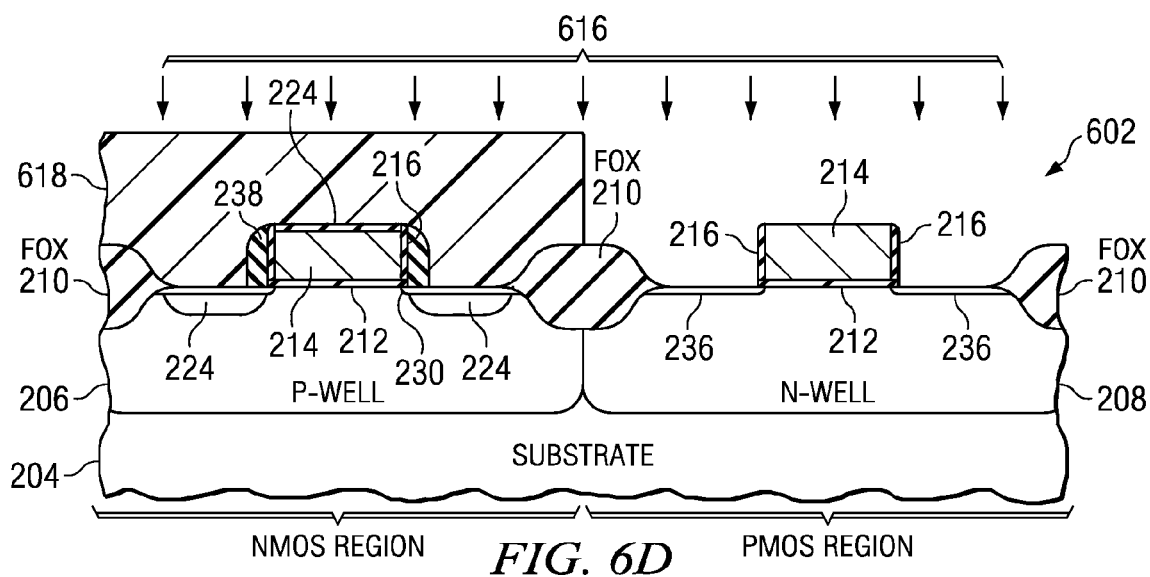
Figure 6E:
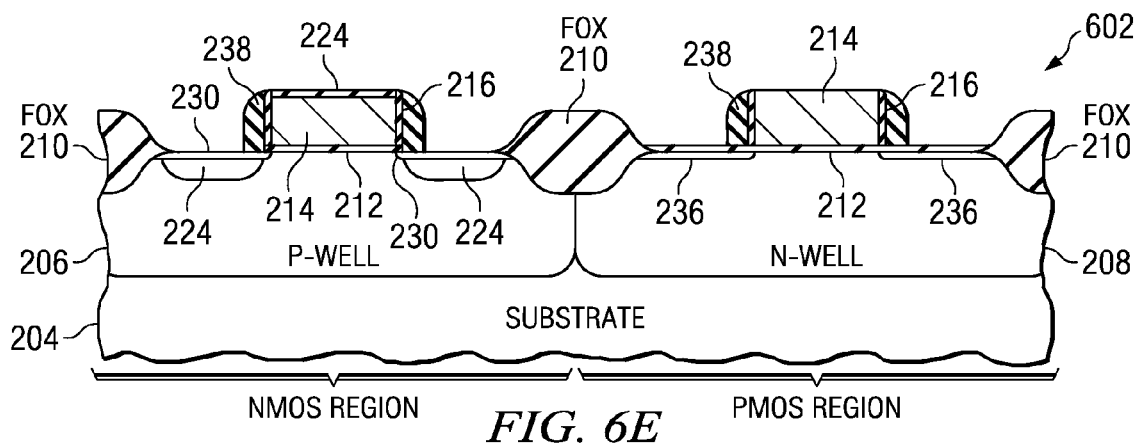
Figure 6F:
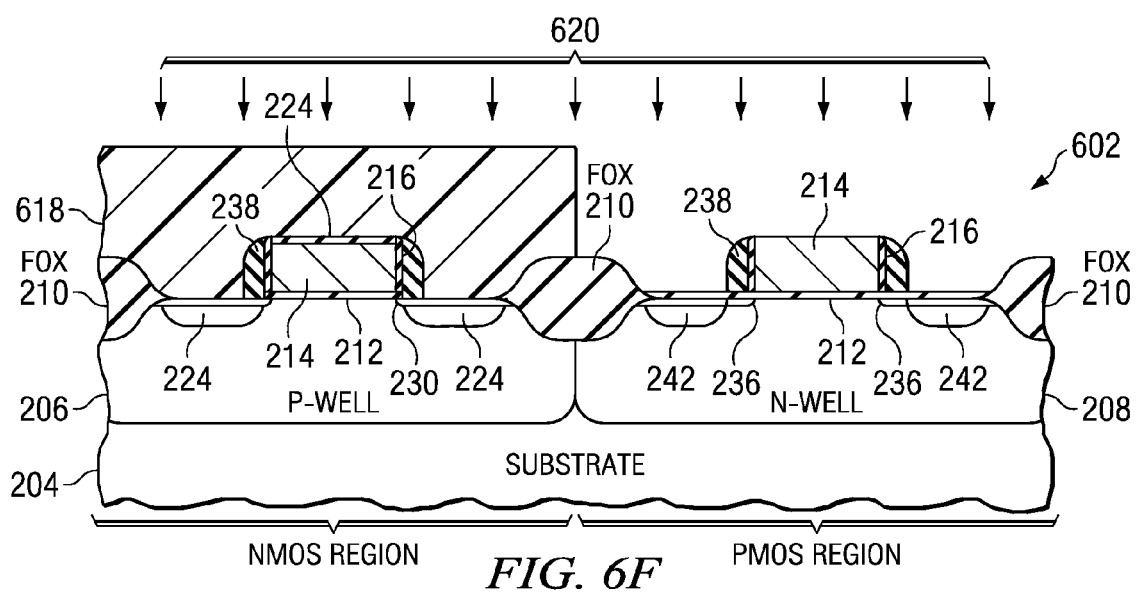
Figure 6G:
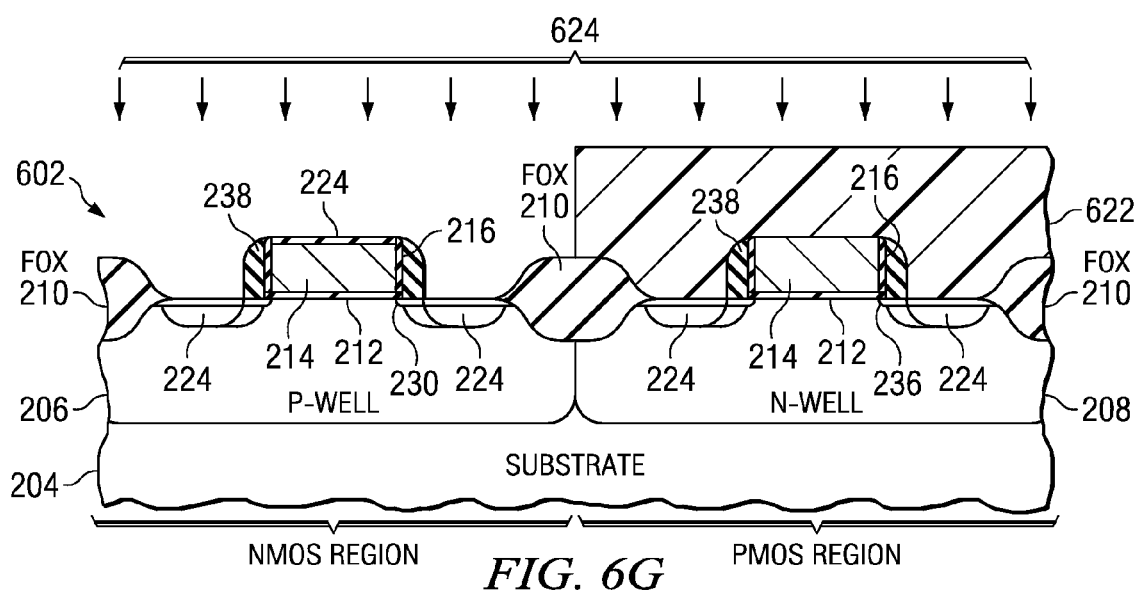

The mask 604 is then removed, and another mask 614 is formed and patterned to overlie the NMOS region, as illustrated in FIG. 6D. A p-type extension region implant 616 is then performed to form p-type extension regions 236 in the PMOS region as shown. The mask 614 is then removed and sidewall spacers 238 are formed over the offset spacers in both the NMOS and PMOS regions, as illustrated in FIG. 6E. Another mask 618 is then formed over the NMOS region (FIG. 6F), and a p-type source/drain implant 620 is performed in the PMOS region to form the source/drain regions 242. The mask 618 is then stripped, and another mask 622 is formed to cover the PMOS region, and an n-type source/drain implant process 624 is provided to form n-type source/drain regions 240, as illustrated in FIG. 6G.

In the above manner, the device may be fabricated with optimized NMOS transistors without any strain applied to the channel in PMOS devices.

In addition, while the invention is described above with respect to the use of carbon to form a silicon-carbon lattice structure, the present invention contemplates the use of any of the elements in group IVa of the periodic table, including silicon, germanium, lead and tin, and such alternatives are contemplated as falling within the scope of the present invention.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A MOS transistor device, comprising:
a semiconductor body of a first conductivity type;
a gate structure overlying the semiconductor body and defining a channel therebelow in the semiconductor body, the gate structure defining lateral edges;
source and drain extension regions of a second conductivity type formed in the semiconductor body on opposing sides of the channel;
stress inducement regions formed in the semiconductor body on opposing sides of the channel and generally corresponding to the source and drain extension regions;
sidewall spacers residing over the lateral edges of the gate structure; and
source and drain regions of the second conductivity type formed in the semiconductor body on opposing sides of the channel, wherein a distance between the source and drain regions is dictated by a width of the gate structure and the sidewall spacers, and wherein the distance is greater than a distance between the stress inducement regions.

2. The MOS transistor device of claim 1, further comprising offset spacers formed on the lateral edges of the gate structure and disposed between the lateral edges of the gate structure and the sidewall spacers, respectively, wherein the distance between the stress inducement regions is dictated by a width of the gate structure and the offset spacers.

3. The MOS transistor device of claim 1, wherein the first conductivity type is p-type and the second conductivity type is n-type, and wherein the stress inducement regions comprise carbon-doped silicon formed by etching recesses in the semiconductor body and forming carbon-doped silicon therein via in-situ doped selective epi deposition.

* * * * *